United States Patent
Chien et al.

(10) Patent No.: US 6,248,661 B1
(45) Date of Patent: Jun. 19, 2001

(54) METHOD FOR MONITORING BUBBLE FORMATION AND ABNORMAL VIA DEFECTS IN A SPIN-ON-GLASS PLANARIZATION, ETCHBACK PROCESS

(75) Inventors: Wen-Cheng Chien, Kaohsiung; Chen-Peng Fan, Hsin-Chu, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/261,992

(22) Filed: Mar. 5, 1999

(51) Int. Cl.[7] ................................. H01L 21/4763
(52) U.S. Cl. ............................ 438/632; 438/670
(58) Field of Search .................... 438/623, 632, 438/645, 646, 781, 795, 466, 670, 790

(56) References Cited

U.S. PATENT DOCUMENTS

| | | | |
|---|---|---|---|
| 4,493,855 | * 1/1985 | Sachdev et al. | 438/670 |
| 5,223,443 | 6/1993 | Chinn et al. | 437/8 |
| 5,370,969 | 12/1994 | Vidusek | 430/272 |
| 5,394,006 | * 2/1995 | Liu | 257/506 |
| 5,554,567 | 9/1996 | Wang | 437/195 |
| 5,694,207 | 12/1997 | Hung et al. | 356/72 |
| 5,716,673 | 2/1998 | Yen et al. | 427/240 |
| 6,121,130 | * 9/2000 | Chua et al. | 438/623 |

\* cited by examiner

*Primary Examiner*—David Nelms
*Assistant Examiner*—Phuc T. Dang
(74) *Attorney, Agent, or Firm*—George O. Saile; Stephen B. Ackerman (57) ABSTRACT

A method for monitoring bubble formation in and over a spin-on glass(SOG) layer during the CVD deposition of a superjacent insulative layer is described wherein a monitor wafer is processed either with or without a metal pattern. After a SOG layer has been deposited and cured, a layer of silicon oxide is deposited over it by CVD. If bubbles are formed during the silicon oxide deposition step as a result of out-gassing of the SOG layer, they are entrapped at or near the SOG/silicon oxide interface. The silicon oxide layer is then subjected to a buffered HF etch which exposes the bubbles either by opening them up by eroding the SOG layer underneath the oxide layer or by bringing the surface of the silicon oxide layer closer to the entrapped bubbles, thereby decorating them to make them visible to a white light scanning tool. The monitor wafer is initially scanned just prior to the SOG deposition to obtain a reference scan. A final scan is made after the deposited surface oxide layer has received the buffered HF etch. Bubbles formed over and in an improperly cured SOG layer, occur in clusters that reveal a swirling pattern, reflecting the spin deposition step. The monitor and method of use provides a convenient means for detecting problems with the SOG deposition and curing process, thereby permitting timely remedial action to re-center a deviate process.

14 Claims, 5 Drawing Sheets

METHOD FOR MONITORING BUBBLE FORMATION AND ABNORMAL VIA DEFECTS IN A SPIN-ON-GLASS PLANARIZATION, ETCHBACK PROCESS

BACKGROUND OF THE INVENTION

1. Field of the Invention

The invention relates to processes for the manufacture of semiconductor devices and more particularly to processes related to the planarization of wafer surfaces by the application of spin-on glass layers.

2. Background to the Invention and Description of Previous Art

Integrated circuits(ICs) are manufactured by first forming discrete semiconductor devices within the surface of silicon wafers. A multi-level metallurgical interconnection network is then formed over the devices, contacting their active elements and wiring them together to create the desired circuits. The wiring layers are formed by depositing an insulating layer over the discrete devices, patterning and etching contact openings into this layer, and then depositing conductive material into these openings. A conductive layer is then applied over the insulating layer and is patterned to form wiring interconnections between the devices, thereby creating a level of basic circuitry. The basic circuits are then further interconnected by utilizing additional wiring levels laid out over additional insulating layers with via pass throughs.

Spin-on coatings have been used in integrated circuit manufacture for many years. These are materials can be applied in liquid form and subsequently hardened or cured to form solid or semi solid layers. The most familiar spin-on materials are photoresists and polyimides which have been used since the early 1970s. The photoresists, of course, are generally used for patterning only and as such, are transient films and do not remain in the finished product. Polyimide films have been used from time to time as dielectric and filler layers but frequently suffer processing incompatibilities such as severe outgassing, thermal instability and deformation by shrinkage. More recently, spin-on glasses(SOGs) have received widespread use and success in wafer surface planarization but have also been plagued by outgassing causing blistering and corrosion problems.

Each time a layer of metallization is formed on an integrated circuit wafer and circuit paths are etched within it, the metal pattern introduces a non-planar surface. When the next insulative layer is deposited, by conformal methods such as CVD (chemical vapor deposition), the irregular surface topology is replicated at the insulative layer surface. In order to prevent the cumulative replication of subjacent metal pattern topologies throughout the various metallization levels, it has become common practice in multi-level integrated circuit manufacture to include a means for planarizing each insulative layer prior to deposition of a metallization layer.

One method for achieving a such planarization method involves the deposition of an SOG in a liquid form, for example a liquid monomer which, when spun onto the wafer surface, flows into the topological contours. After deposition, the material is dried and cured to form a polymeric insulative film with a smooth, essentially planar, surface for deposition of a subsequent metal layer. The SOGs consist of alcohol soluble silicates and siloxanes which can attain the properties of inorganic glasses when properly cured. The SOGs have found wide acceptance in recent sub-micron semiconductor processing technology because of their low defect density, simplified processing, and low thermal budget. However, the SOG layers have been generally limited to thicknesses of only a few thousand Angstroms. Thicker layers tend to crack and require longer and more careful curing times. A common method of usage is to first deposit a layer of PECVD(plasma-enhanced CVD) silicon oxide over a layer of patterned metallization and then lay the SOG over it. The SOG fills in the narrow features. It is then etched back by anisotropic etching to the PECVD oxide surface. The result is the original PECVD layer with the small spacings filled with SOG.

The SOG is deposited by a nozzle directed at the center of a rapidly spinning wafer. Centrifugal force distributes the liquid over the wafer. Excess liquid is flung from the edge of the wafer. The apparatus used to perform this task is of the same type that is conventionally used to deposit photoresist. The wafer is then allowed to dry briefly and then the SOG is cured, typically by a sequence of hot plate baking steps. The curing process is difficult in that it requires a delicate balance between the rate of solvent and polymerization by-product removal and the rate of formation of the polymer. Failure to provide the proper balance results in cracking and inclusion of impurities which can produce cause subsequent metal corrosion. Residual solvent, moisture and polymerization by-products due to improper or insufficient curing can bring about bubble formation and blistering in films subsequently deposited on the SOG layer. Not only are SOG films subject to contain curing residuals, they are also prone to absorb moisture and contaminants from the atmosphere. It has been demonstrated by Wang, U.S. Pat. No. 5,554,567, that SOG films left in the open air after curing for more than about three hours were prone to blistering when an insulative layer was then deposited over them.

Much effort has been devoted to improve the gap-filling and planarization aspects of spin-on glasses while at the same time making the films more stable and free of agents which cause out-gassing and decomposition of the SOG as well as corrosion and degradation of adjacent integrated circuit elements. Yen, et.al., U.S. Pat. No. 5,716,673 cite a process for improving planarity and gap filling by SOGs by slowing the evaporation rate of solvent after deposition by slow-spinning the deposited SOG in a controlled environment.

Vidusek, U.S. Pat. No. 5,370,969 reports out-gas resistant planarization materials which can be spin deposited like an SOG. A novolac polymer, and polydimethyl-glutarimide are cited as non nitrogen bubble generating materials. These materials are used in a planarization process to facilitate a photo lithographic process and are thereby transitory and not becoming a permanent part of the integrated circuit. These materials are unstable at temperatures above 300° C. and will decompose when during subsequent processing procedures which call for higher temperatures. Hung, et.al., U.S. Pat. No. 5,694,207 shows a method for monitoring the etch rate of an SOG layer by optical emission spectroscopy.

Methods for easy, reliable detection of residues, left behind in various processing steps, in particular, chemical stripping operations of photoresist, have been developed over the years. Many of these methods involve means for making the defective sites more visible. This procedure is commonly referred to as decoration. The procedure is accomplished by enlarging the defect site by selectively etching of material exposed by the defect. Chinn, et.al., U.S. Pat. No. 5,223,443 describes a method for decorating sites where particles of photoresist have been left behind on a polysilicon layer after an inadequate photoresist strip. A thin layer of silicon oxide is deposited on the wafer. The layer is so thin that the photoresist particles remain exposed. The residue sites are then decorated by an etch in aqueous KOH whereby, not only are the photoresist particles removed, but the subjacent polysilicon is attacked, making the site easily visible.

Micro bubbles tend to form in SOG layers and in layers of silicon oxide deposited over cured SOG layers. The micro bubbles result from out-gassing of the SOG layers during the silicon oxide deposition. Because the silicon oxide layers are relatively thin, the micro bubbles are prone to cause pinholes and virtual defects which are of reliability concern in the silicon oxide layers. In a process wherein the SOG layer and the silicon oxide top layer comprise an interlayer dielectric (ILD) or intermetal dielectric(IMD), the pinholes and defects caused by the SOG bubbles in silicon oxide layers deposited over SOG bring about abnormal vias, via-via shorts, metal opens, and metal bridging shorts. It is of great importance to have a timely method for detection and identification of micro bubble problems in dielectric layers involving SOG. Such a method is provided by this invention.

SUMMARY OF THE INVENTION

It is an object of this invention to provide a method for measuring the density of micro bubbles formed in layers deposited over SOG layers.

It is yet another object of this invention to provide a method for decorating and thereby improving the ability to detect micro bubbles formed in SOG layers and in layers deposited over SOG layers.

It is yet another object of this invention to provide a method for monitoring abnormal via defects caused by the formation of micro bubbles formed in an IMD layer comprising a CVD layer deposited over a SOG layer.

It is another object of this invention to provide a method for monitoring an in-line SOG curing process by detecting and measuring the density of micro bubbles formed over SOG layers during subsequent processing steps and thereby flagging process deviations and urging remedial measures.

It is still another object of this invention to provide a method for determining the quality of a dielectric layer containing SOG in a timely fashion so as to flag defective units in time to prevent wasteful further processing of defective units.

These objects are accomplished by the introduction of monitor wafers into the SOG processing cycle. The monitor wafers may be patterned to more closely represent integrated circuit wafers or they may consist of unpatterned wafers which are subjected to the processing steps involved in the SOG planarization etchback process. Prior to the deposition of the SOG layer the surface of the monitor wafer is scanned by a surface imaging tool to provide reference data. The monitor wafer is then spin coated with SOG. The SOG is cured, planarized, coated with an insulative layer according to the normal process flow of the manufacturing line. After the insulative layer is deposited on the planarized SOG, the wafer is etched with HF to decorate defects in the layers, thereby enhancing their detection by the scanning tool. The wafer is then scanned again by the imaging tool and the image data is referenced against the initial scan which cancels out prior defects as well as any patterned features on the wafer. Only defects introduced during the SOG process are revealed. The etching process serves to open any bubbles or other voids present in the insulative layer, thus, exposing the defects. The wafer is scanned by a white light imaging scanner which identifies and counts the defects on the wafer. In addition the tool provides an image showing the locations of the defects.

DESCRIPTION OF THE PREFERRED EMBODIMENTS

Figure 1A:
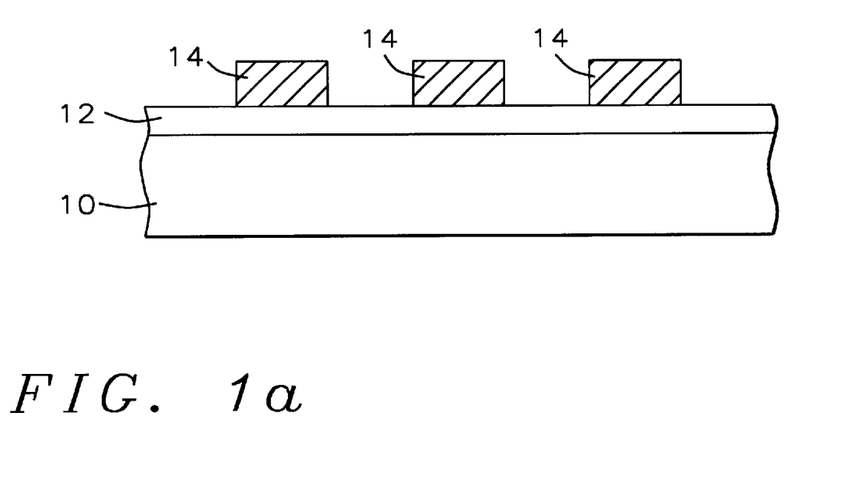
FIGS. 1A through FIG. 1D are cross sections of a portion of a patterned monitor wafer showing the steps for processing of the monitor wafer to detect and measure of bubble formation in an SOG process according to a first embodiment of the current invention.

In a first embodiment of the current invention, a patterned monitor wafer is formed for assessing the quality of SOG layers in an integrated circuit manufacturing process. Referring to FIG. 1A a silicon wafer 10 is provided and a silicon oxide layer 12 is deposited to a thickness of between about 0.4 and 0.6 microns. The silicon oxide layer 12 is deposited, preferable by PECVD although other conventional CVD methods such as LPCVD (low pressure CVD) may also be used. A metal, preferable aluminum is then deposited by evaporation or sputtering and etched to form a pattern of lines 14 representative of the processing technology to which the manufacturing process is dedicated. In the present embodiment, features representing a 0.6 micron technology are addressed and the metal line pattern 14 is between about 4.5 and 5.0 microns thick.

A conformal silicon oxide layer 16 is next deposited over the metal pattern 14 by PECVD to a thickness of between about 1,500 and 2,500 Angstroms. The surface of the wafer 10 is now subjected to a preliminary surface scan by an optical scanning tool which records detects defects such as particles, pits, mounds, voids, and other surface imperfections. By performing a surface scan of the wafer before and after the process, which is being investigated for defect generation, it is possible to subtract the contributions of the features which were on the wafer surface before the process step was performed. This includes the intentional features such as the metal pattern itself, as well as any defects which were on the wafer but were not introduced by the process step being examined.

A suitable scanning tool is the Model 2131 manufactured by the KLA-Tencor Corporation, 160 Rio Robles, San Jose, Calif. 95134. The Model 2131 scans the wafer with white light and utilizes a comparison technique to characterizes the various defects.

After the initial reference data has been taken and recorded by the scanning tool, a SOG layer 18 is applied over the conformal silicon oxide layer 16 by a spin-on process whereby the uneven topology of the metal features is covered and the outer surface is essentially planar because the SOG liquid flows into the spaces between the features. Conventional wafer spinning equipment is used to form the SOG coating. In the current embodiment the SOG precursor is an alcohol soluble siloxane available from Allied Signal Corporation, Morristown, N.J., 07960, Tel: 201-455-2000, under the trade name of 111. Alternately, another SOG formulation may be used in the embodiment, for example a soluble silicate or a polyimide. The SOG liquid is spun onto the wafer in three successive applications. Each application deposits about 1,200 Angstroms of film. After each application the wafer is cured by sequential baking on different temperature hot plates at between about 100 and 250° C. A suitable hotplate baking sequence is 1 minute at 100° C., 2 minutes at 160° C., and 1 minute at 250° C. The final thickness of the cured SOG 18 layer is between about 3,500 and 3,700 Angstroms.

Figure 1B:
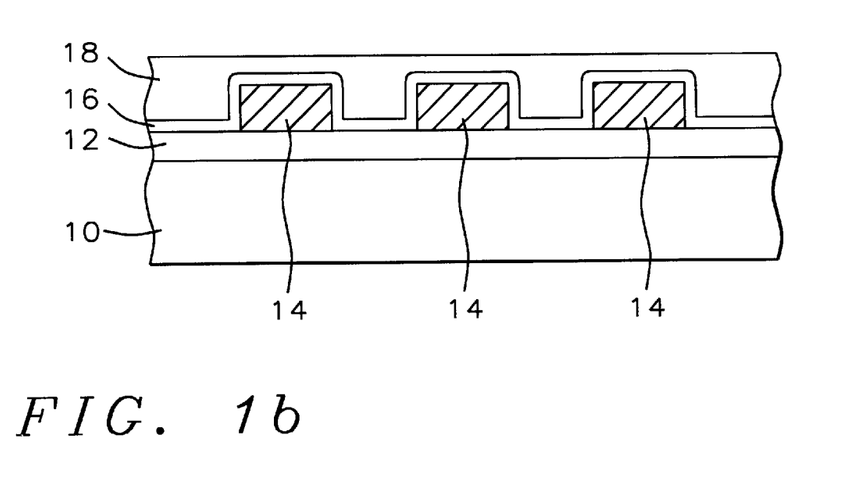
Figure 1C:
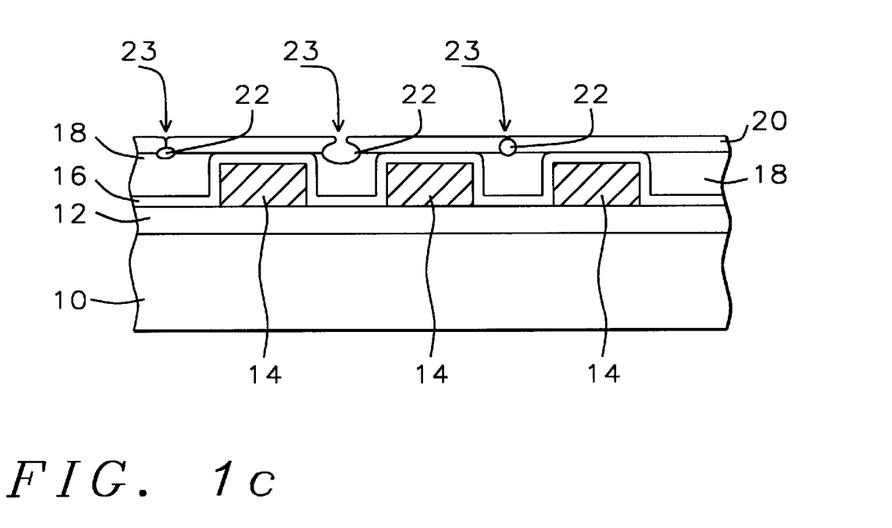

Illustrated in FIG. 1B, the SOG layer 18 has an essentially planar surface and extends above the metal features 14. The SOG layer 18 is etched back to expose the silicon oxide layer 16 by (RIE)reactive ion etching. This form of plasma etching is anisotropic and etches the SOG layer 18 back to the silicon oxide layer 16 while maintaining the planar surface. RIE etchback of SOG layers is a well known practice and is accomplished using plasma etchants containing fluorocarbons. FIG. 1C shows a cross section of the wafer 10 and the SOG layer 18 after the RIE etchback.

In an alternative, the SOG is only partially etched back by RIE so that between about 700 and 1,000 Angstroms of the SOG remains over the metal pattern 14. In this alternative bubble formation can occur over the metal pattern features as well. In a second alternative the RIE etchback may be omitted altogether.

Referring to FIG. 1C, a silicon oxide layer 20 is formed over the etched back SOG layer 18. The layer 20 is preferably formed by PECVD using $N_2O$ and $SiH_4$ at a deposition temperature of between about 360 and 440° C. The layer 20 is deposited to a thickness of between about 5,000 and 5,500 Angstroms.

In an improperly centered process, that is, in a process not operating under optimum conditions, tiny bubbles 22 form and grow in the SOG layer 18. Many of these bubbles outgas and burst at surface of the SOG layer 18 causing distortions and pinholes 23 in the silicon oxide layer. These micro bubbles 18 are primarily nucleated during the SOG deposition and curing process and grow in size during the deposition of the silicon oxide layer 20. The bubbles 22 are formed of gaseous components emitted from the SOG layer during the deposition of the silicon oxide layer 20. Although some of voids caused by the bubbles 22 may protrude out of the surface of the layer 20, many are confined beneath the surface and are not visible by surface observation.

In the present embodiment the layer 20 is silicon oxide. Alternatively silicon nitride or of silicon oxynitride can be used for the layer 20. The results with regard to bubble formation are the same as those observed with a silicon oxide layer 20.

Figure 2A:
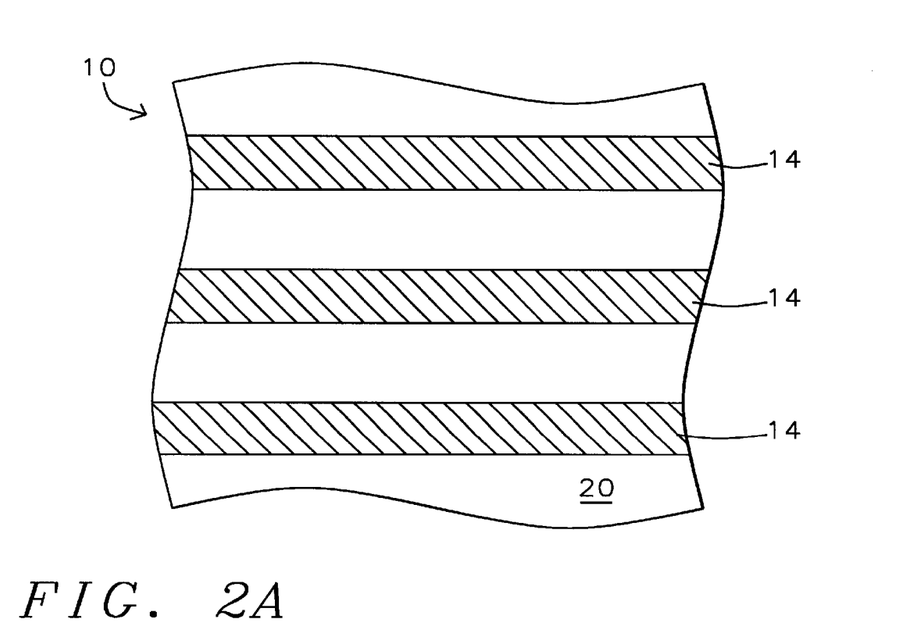
FIG. 2A and FIG. 2B are plan views of a section of a patterned monitor wafer respectively before and after decoration of bubble defects by the method of the invention.

FIG. 2A is a planar view of the wafer 10 cross section shown in FIG. 1C. The bubbles 22 cannot be seen. The bubbles 22 can also go unobserved by a scanning tool such as the one used to detect defects on the wafer surface. In order to reveal bubbles lying under the oxide layer surface, the wafer 10 is etched in an aqueous HF etchant which attacks the silicon oxide layer 20, opening up some of the bubbles, and thinning the oxide layer 20 sufficiently to make the sub-surface bubbles visible by optical observation. The etchant used in the current embodiment is prepared by combining 10 parts by volume of a 40 wt % (12.75 molar) $NH_4F$ solution with one part by volume of concentrated 49 wt % (28.3 molar) HF. This etchant is referred to as 10:1 BOE (buffered oxide etch). A dip of between about 40 and 50 seconds in 10:1 BOE at room temperature is sufficient to properly decorate the bubbles for a subsequent KLA surface scan.

Figure 1D:
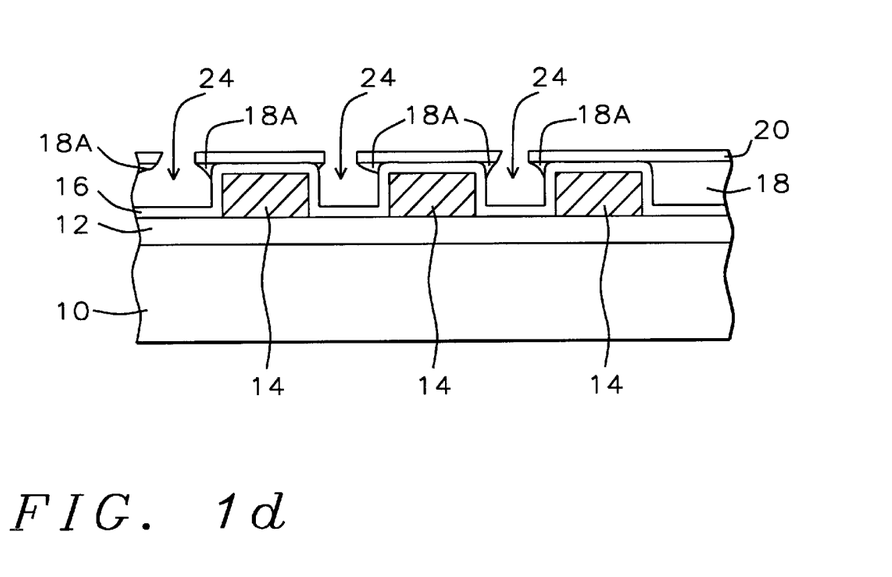
Figure 2B:
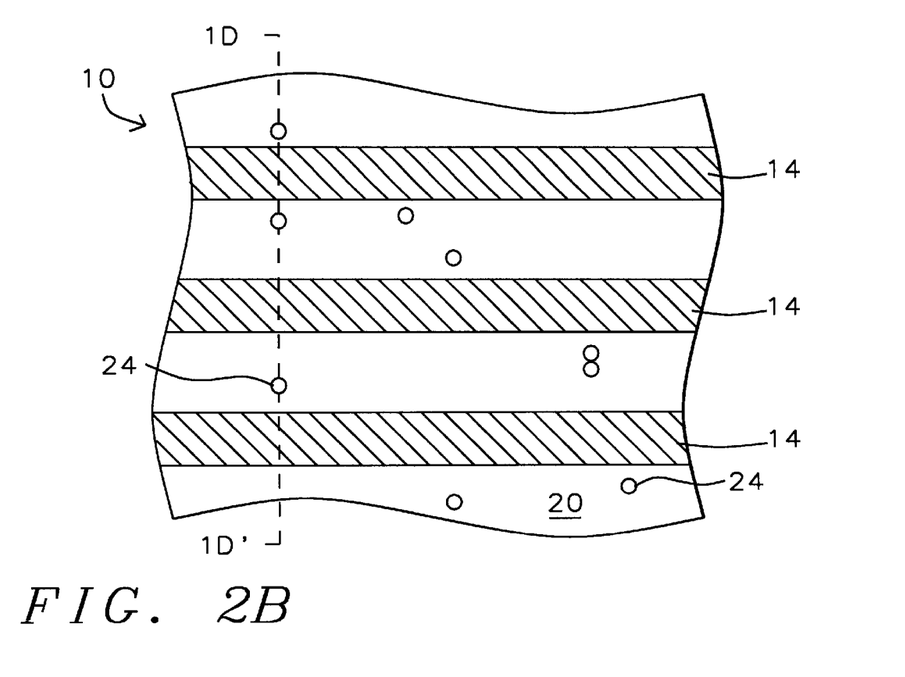

FIG. 1D shows the cross section of FIG. 1C after the BOE has exposed the entrapped bubbles 22. The BOE has penetrated the pinholes in the oxide layer 20 and etched out large pockets 24 in the subjacent SOG layer 18. The pinholes in the silicon oxide layer are enlarged by the BOE allowing access of the BOE to the much faster etching SOG. Small regions 18A of SOG remain in the pockets 24. FIG. 2B is a planar view of the wafer 10 after the BOE dip showing the bubbles 22 exposed by the etchant. The section 1D–1D' is the plane of the cross section shown in FIG. 1D, Partial etching of the silicon oxide layer 20 by the BOE causes the bubbles at the oxide/SOG interface to be revealed to inspection by an optical microscope. After decoration by the 10:1 BOE, the monitor wafer 10 is again scanned by the wafer scanner and, after subtracting the reference scan image, a map is produced showing the location of the decorated bubbles 24.

Figure 3A:
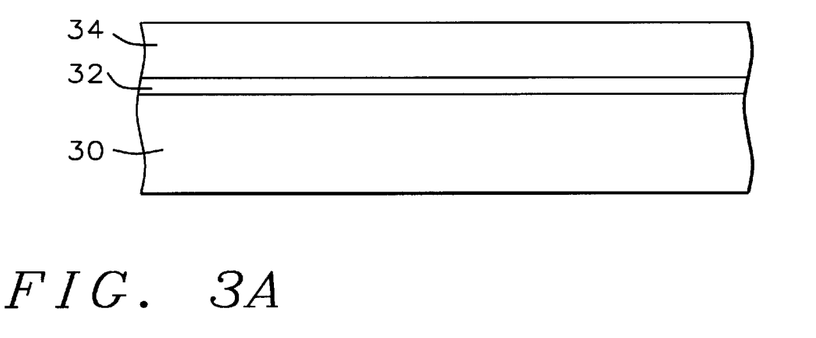
FIGS. 3A through 3C are cross sections of a portion of an un-patterned monitor wafer showing the steps for processing of the monitor wafer to detect and measure of bubble formation in an SOG process according to a second embodiment of the invention.

In a second embodiment a monitor wafer is formed without a metal pattern. The procedure is identical to that for the first embodiment except that the initial insulative layer 12 and the metal 14 deposition and patterning steps are omitted. FIG. 3A shows a cross section of a blank patternless wafer 30 whereupon a silicon oxide layer 32 has been deposited by PECVD to a thickness of between about 4,000 and 5,000 Angstroms. The surface of the wafer 30 is subjected to a preliminary surface scan by an optical scanning tool which records detects defects such as particles, pits, mounds, voids, and other surface imperfections. The surface scan is performed directly after the silicon oxide layer 32 is deposited. By performing a surface scan of the wafer before and after the process which is being investigated for defect generation, any features which are initially present on the wafer surface before the process step was performed may be canceled out. These include defects which were on the wafer but were not introduced by the process step being examined. A suitable scanning tool is the Model 2131 manufactured by the KLA-Tencor Corporation, 160 Rio Robles, San Jose, Calif. 95134.

After the initial reference data has been taken and recorded by the scanning tool, a SOG layer 34 is applied over the silicon oxide layer 32 by a spin-on process whereby the wafer is covered by an even layer of SOG. Conventional wafer spinning equipment is used to form the SOG coating. In the current embodiment the SOG precursor is an alcohol soluble siloxane available from Allied Signal Corporation, Morristown, N.J., 07960, Tel: 201-455-2000, under the trade name of 111. Alternately, another SOG formulation may be used in the embodiment, for example a soluble silicate or a polyimide. The SOG liquid is spun onto the wafer in three successive applications and the baking procedures applied to cure the SOG are identical to those applied in the first embodiment. Each application deposits about 1,200 Angstroms of SOG film. The final thickness of the cured SOG layer 34 is between about 3,500 and 3,700 Angstroms.

The SOG layer 34 is partially etched back by RIE leaving the layer 34 between about 1,700 and 1,900 Angstroms thick. The RIE etchback of SOG layers is a well known practice and is accomplished using plasma etchants containing fluorocarbons. Alternately the RIE etchback may be omitted.

Figure 3B:
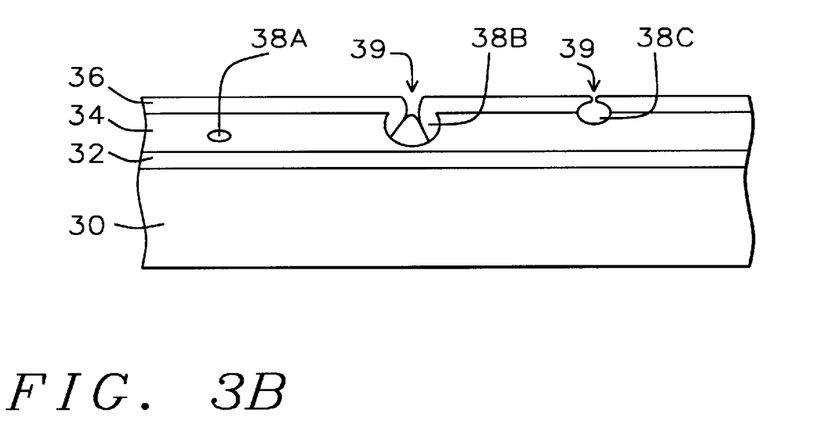

Referring to FIG. 3B, a silicon oxide layer 36 is formed over the etched back SOG layer 34. The layer 36 is preferably formed by PECVD using $N_2O$ and $SiH_4$ at a deposition temperature of between about 350 and 450° C. The layer 36 is deposited to a thickness of between about 5,000 and 5,500 Angstroms.

In an improperly centered process, that is, in a process is not operating under optimum conditions, tiny bubbles 38A, B,C are formed in the SOG layer. 34. These micro bubbles 38A,B,C are primarily nucleated during the SOG deposition and curing process and grow in size during the deposition of the silicon oxide layer 36. Many of these bubbles outgas and burst at surface of the SOG layer 18 causing distortions and pinholes 39 in the silicon oxide layer 36. The micro bubbles 38 are formed of gaseous components emitted from the SOG layer during the deposition of the silicon oxide layer 36. Although some of the bubbles 38 may protrude out of the surface of the oxide layer 36, most are confined beneath the surface and are not visible by conventional observation.

Figure 3C:
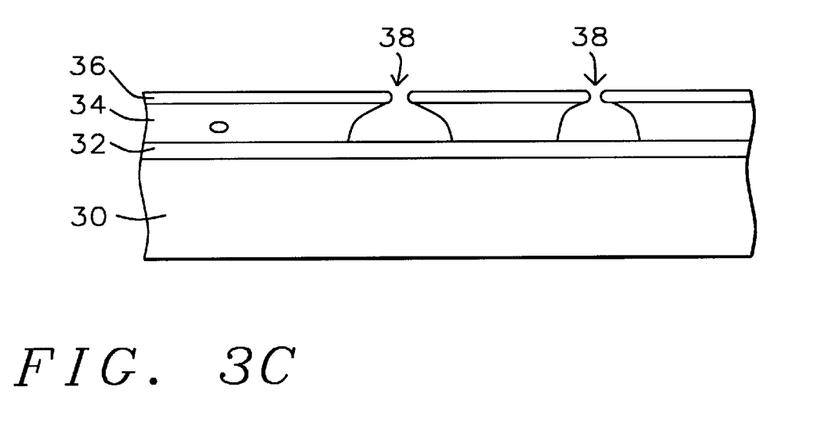

In order to reveal the bubbles lying under the oxide layer surface, the oxide layer 36 is etched in an aqueous HF etchant, opening up some of the bubbles, and thinning the oxide layer 36 sufficiently to make sub-surface bubbles visible to optical observation. The etchant used in the current embodiment is prepared by combining 10 parts by volume of a 40 wt % (12.75 molar) $NH_4F$ solution with one part by volume of concentrated 49 wt % (28.3 molar) HF. This etchant is referred to as 10:1 BOE (buffered oxide etch). A dip of between about 40 and 50 seconds in 10:1 BOE at room temperature is sufficient to properly decorate the bubbles for a subsequent KLA surface scan. FIG. 3C shows the cross section of FIG. 3B after the buffered etch step. The bubbles 38B,C are penetrated by the etch through pinholes or channels 39 in the silicon oxide layer 36. Those that are not opened, like the bubble 38A, are usually close enough to the surface of the oxide to be detected by the scanning tool.

Figure 4:
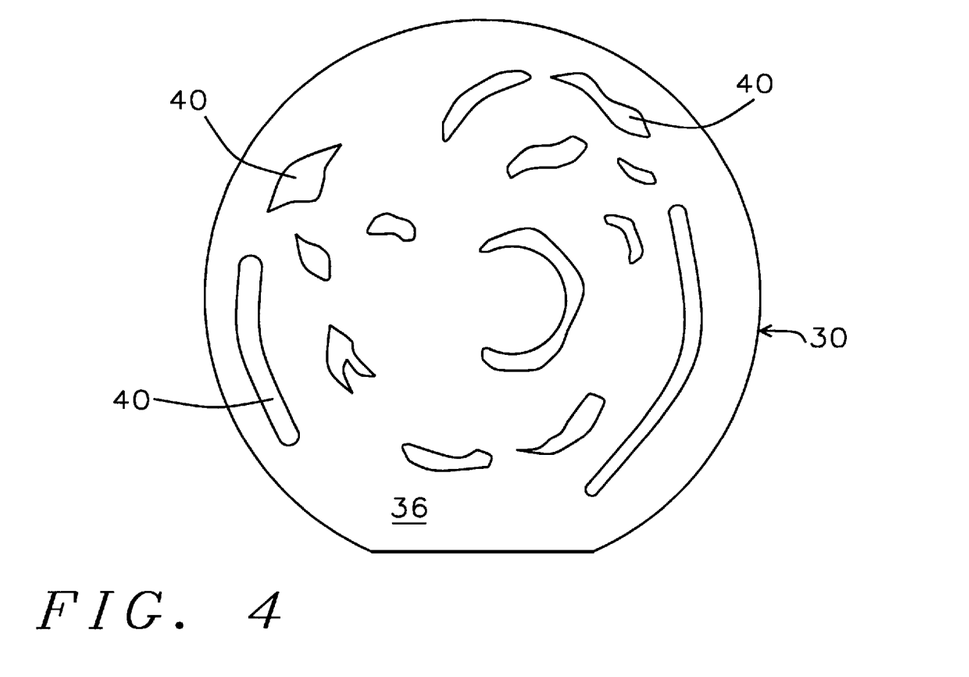
FIG. 4 is a scanned image of the surface of an un-patterned wafer made by a wafer surface scanning tool showing bubble cluster patterns over an SOG layer prepared and viewed according to the method of the second embodiment of the invention.
Figure 5:
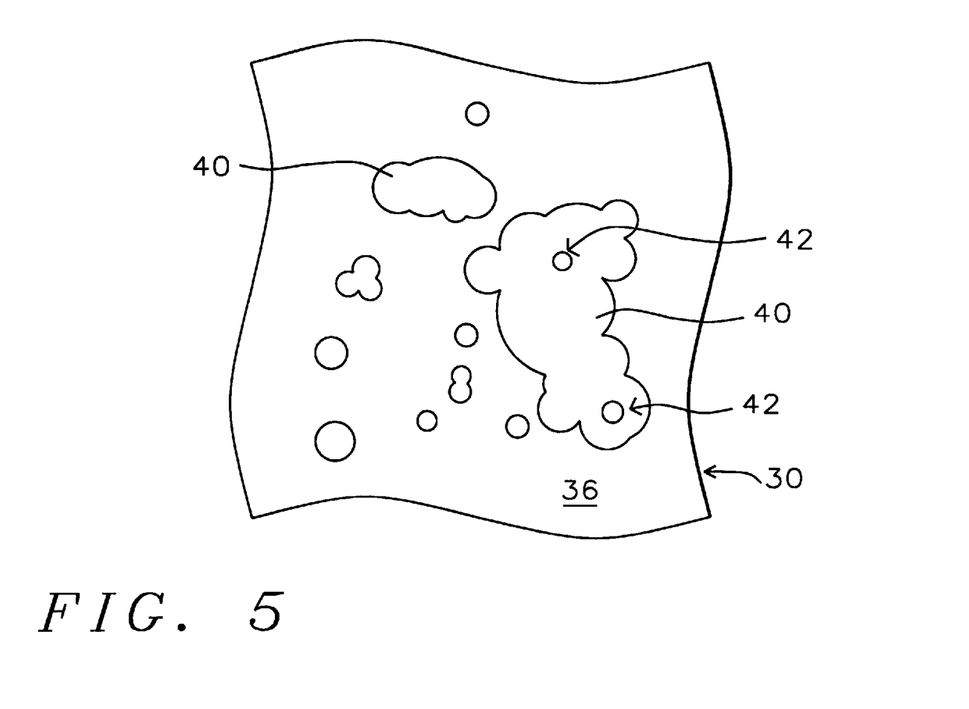
FIG. 5 is a drawing made from an optical micrograph showing an enlarged cluster of bubbles over an SOG layer prepared according to the method of the second embodiment of this invention.

A map of an unpatterned monitor wafer 30 with a severely bubble impacted SOG layer produced by the scanning tool is shown schematically in FIG. 4. The micro bubbles occur in clusters 40 which have an overall swirling tendency which reflects the manner in which the SOG layer was spun onto the wafer. FIG. 5 is a representation of an optical photomicrograph showing an enlarged portion of a bubble cluster 40. The large openings 42 are regions where bubbles have penetrated the surface of the silicon oxide layer 36.

The embodiment uses a silicon wafer substrate. It should be understood by those skilled in the art that other substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

What is claimed is:

1. A method for monitoring pinholes and bubble defects formed over a spin-on glass layer during deposition of a superjacent layer comprising:

(a) providing a silicon wafer;
(b) forming a first insulative layer on said silicon wafer;
(c) depositing and patterning a metal layer on said first insulative layer, thereby forming a metal pattern;
(d) conformally depositing a second insulative layer on said metal pattern;
(e) performing an initial scan of the surface of said wafer with a white light scanning tool and recording initial surface profile data;
(f) depositing a spin-on glass layer over said metal pattern thereby forming a planar surface;
(g) curing said spin-on glass layer;
(h) plasma etching said spin-on glass layer;
(i) depositing a third insulative layer on said spin-on glass layer;
(j) etching said wafer with an aqueous oxide etchant, thereby decorating pinholes and micro bubbles in said third insulative layer by penetrating and enlarging said pinholes and micro bubbles and forming subjacent discrete etched out pockets in said spin-on-glass layer which can be observed with said scanning tool;
(k) performing a final scan of the surface of said wafer with said scanning tool and recording final surface profile data; and
(l) forming a wafer map of the differences between said final surface profile data and said initial surface profile data whereby said wafer map reveals said etched out pockets under pinholes and bubble defects incurred in said third insulative layer.

2. The method of claim 1 wherein said second insulative layer is silicon oxide and is between about 1,500 and 2,500 Angstroms thick.

3. The method of claim 1 wherein said spin-on glass layer is deposited by a plurality of successive spin-on deposition and curing steps.

4. The method of claim 1 wherein said etching of said spin-on glass layer is reactive ion etching.

5. The method of claim 1 wherein said etching of said spin-on glass layer is terminated when said second insulative layer is exposed over said metal pattern.

6. The method of claim 1 wherein said third insulative layer is deposited by a CVD process.

7. The method of claim 1 wherein said third insulative layer is silicon oxide and is between about 5,000 and 5,500 Angstroms thick.

8. The method of claim 7 wherein said aqueous oxide etchant is prepared by combining about 10 parts by volume of a 40 wt % (12.75 molar) $NH_4F$ solution with one part by volume of concentrated 49 wt % (28.3 molar) HF and said aqueous etchant is applied to said third insulative layer for a period of between about 40 and 50 seconds.

9. A method for monitoring pinholes and bubble defects formed during deposition of an insulative layer over a spin-on glass layer comprising:

(a) providing a silicon wafer;
(b) forming a first insulative layer on said silicon wafer;
(c) performing an initial scan of the surface of said wafer with a white light scanning tool and recording initial surface profile data;
(d) depositing a spin-on glass layer on said first insulative layer;
(e) curing said spin-on glass layer;
(f) etching said spin-on glass layer;
(g) depositing a second insulative layer on said spin-on glass layer;
(h) treating said wafer with an aqueous oxide etchant, thereby decorating pinholes and micro bubbles in said third insulative layer by penetrating and enlarging said pinholes and micro bubbles and forming distinct subjacent, etched out pockets in said spin-on-glass layer which can be observed with said scanning tool;
(i) performing a final scan of the surface of said wafer with said scanning tool and recording final surface profile data; and (j) forming a wafer map of the differences between said final surface profile data and said initial surface profile data whereby said wafer map reveals and characterizes bubble defects incurred in said second insulative layer.

10. The method of claim 9 wherein said spin-on glass layer is deposited by a plurality of successive spin-on deposition and curing steps.

11. The method of claim 9 wherein said etching of said spin-on glass layer is reactive ion etching.

12. The method of claim 9 wherein said third insulative layer is deposited by a CVD process.

13. The method of claim 9 wherein said second insulative layer is silicon oxide and is between about 5,000 and 5,500 Angstroms thick.

14. The method of claim 13 wherein said aqueous oxide etchant is prepared by combining about 10 parts by volume of a 40 wt % (12.75 molar) $NH_4F$ solution with one part by volume of concentrated 49 wt % (28.3 molar) HF and said aqueous etchant is applied to said second insulative layer for a period of between about 40 and 50 seconds.

* * * * *